(12) United States Patent
Burden

(10) Patent No.: US 6,653,658 B2
(45) Date of Patent: Nov. 25, 2003

(54) SEMICONDUCTOR WAFERS WITH INTEGRATED HEAT SPREADING LAYER

(75) Inventor: Stephen J. Burden, Golden, CO (US)

(73) Assignee: Isonics Corporation, Golden, CO (US)

( * ) Notice: Subject to any disclaimer, the term of this patent is extended or adjusted under 35 U.S.C. 154(b) by 0 days.

(21) Appl. No.: 10/189,731

(22) Filed: Jul. 3, 2002

(65) Prior Publication Data

US 2003/0010978 A1 Jan. 16, 2003

Related U.S. Application Data

(60) Provisional application No. 60/303,455, filed on Jul. 5, 2001.

(51) Int. Cl.[7] ............................................. H01L 29/12
(52) U.S. Cl. ...................... 257/76; 257/183; 257/798; 438/312; 438/528
(58) Field of Search ........................ 257/76, 183, 798; 438/528, 312

(56) References Cited

U.S. PATENT DOCUMENTS

| | | | | |
|---|---|---|---|---|
| 4,722,763 A | * | 2/1988 | Pa et al. ........................ | 117/81 |
| 5,144,409 A | | 9/1992 | Ma ................................. | 357/61 |
| 5,442,191 A | * | 8/1995 | Ma ................................. | 257/1 |
| 5,917,195 A | * | 6/1999 | Brown .......................... | 257/22 |
| 6,084,895 A | * | 7/2000 | Kouchi et al. ................ | 372/36 |
| 6,344,375 B1 | * | 2/2002 | Orita et al. ................... | 438/151 |
| 6,365,098 B1 | | 4/2002 | Fulbright ...................... | 420/578 |

FOREIGN PATENT DOCUMENTS

| JP | 20002000069557 | 12/2000 |
|---|---|---|
| JP | 20002000007224 | 7/2001 |

* cited by examiner

*Primary Examiner*—Jerome Jackson
(74) *Attorney, Agent, or Firm*—Sheridan Ross P.C.

(57) ABSTRACT

The invention is directed to semiconductor wafer structures having increased thermal conductivity over conventional semiconductor wafer designs due to the inclusion of an isotopically-enriched material on at least one surface of the wafer substrate. The isotopically-enriched material may be isotopically-enriched silicon, germanium, silicon-germanium alloys, gallium arsenide, aluminum gallium arsenide, gallium nitride, gallium phosphide, gallium indium nitride, indium phosphide or combinations and alloys of these materials. In another embodiment, the substrate is removed from the wafer structure to leave a top semiconductor layer on a layer of isotopically-enriched materials with no underlying substrate.

20 Claims, 1 Drawing Sheet

SEMICONDUCTOR WAFERS WITH INTEGRATED HEAT SPREADING LAYER

CROSS-REFERENCE TO RELATED APPLICATIONS

This application claims the benefit of U.S. Provisional Application No. 60/303,455 filed Jul. 5, 2001, which is incorporated herein in its entirety by this reference.

FIELD OF THE INVENTION

The present invention relates to methods of making improved semiconductor wafers with heat spreading layers of isotopically pure semiconductor materials and the wafers derived from these methods.

BACKGROUND OF THE INVENTION

Silicon, germanium, and gallium compounds are commonly used to fabricate semiconductor wafers. In the naturally occurring forms, silicon is composed of approximately 92.2% $^{28}$Si, 4.7% $^{29}$Si, and 3.1% $^{30}$Si; germanium is composed of approximately 20.5% $^{70}$Ge, 27.4% $^{72}$Ge, 7.8% $^{73}$Ge, 36.5% $^{74}$Ge, and 7.8% $^{76}$Ge; and gallium is composed of approximately 60.4% $^{69}$Ga and 39.6% $^{71}$Ga, which are roughly the composition of crystals used by the semiconductor industry. However, semiconductor devices composed of naturally occurring silicon, germanium, and gallium have properties such as carrier mobility which place limits upon the semiconductor speed since carrier mobility governs signal transit times in semiconductor materials. Power dissipation in a semiconductor is limited by the thermal conductivity of the materials from which it is made. This thermal conductivity in turn limits the packing density of the transistors on a semiconductor wafer or the amount of power that can be generated in a device without inducing device failure.

In an effort to reduce the price for gallium arsenide or gallium nitride based devices, investigation into the uses of other substrate materials such as germanium, sapphire and silicon carbide have been investigated. Recently several organizations have been successful in using silicon as a substrate material to grow thin film devices based on gallium compounds.

One of the limiting factors in the lifetimes of thin film devices is the power output, i.e., high power devices such as semiconductor lasers and LED's have shorter lifetimes when operated at higher power because higher temperatures are generated causing degradation of the materials. Many devices use external cooling methods such as copper heatsinks to limit the temperature rise of the device, but further improvements in cooling technology are necessary to allow these devices to be used in higher brightness or high power applications.

Semiconductor wafers with increased thermal conductivity will allow for increased power densities in these devices, thereby enhancing the performance of many electronic devices now on the market.

SUMMARY OF THE INVENTION

Accordingly, the present invention is directed to wafer structures having increased thermal conductivity over conventional semiconductor wafer designs. In one embodiment, the invention provides a wafer having a layer of an isotopically-enriched material on at least one surface of the substrate. The isotopically-enriched material may be isotopically-enriched silicon, germanium, silicon-germanium alloys, gallium arsenide, aluminum gallium arsenide, gallium nitride, gallium phosphide, gallium indium nitride, indium phosphide or combinations and alloys of these materials.

In another embodiment, the wafer structure includes an additional top semiconductor layer formed on the layer of isotopically-enriched material. Optionally, a semiconductor device is formed in the top semiconductor layer.

The invention provides methods of making these wafers including methods of removing the substrate from the wafer to leave a top semiconductor layer on a layer of isotopically-enriched materials with no underlying substrate.

In one embodiment, the wafer structure comprises silicon enriched to at least 98% $^{28}$Si, and the semiconductor layer comprises silicon having naturally-occurring isotopic ratios.

DETAILED DESCRIPTION OF THE INVENTION

Figure 1:
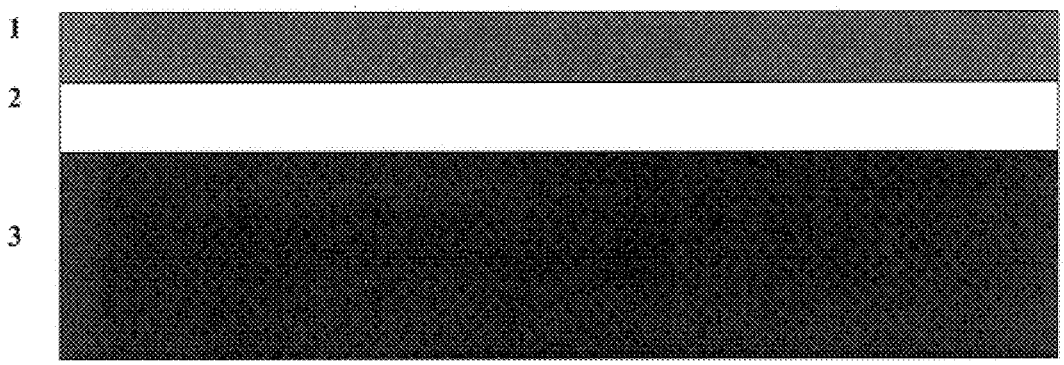
FIG. 1 shows the general wafer structure of the present invention. Layer 1 is the semiconductor material layer or layers composed of natural isotopic ratios, layer 2 is the heat spreading layer composed of isotopically enriched materials, and 3 is the substrate material.

Isotopically-enriched $^{28}$Si has been shown to have a thermal conductivity 60% to 600% higher than naturally occurring silicon as described in Capinski et al., *Thermal Conductivity of Isotopically-enriched Si*, Applied Physics Letters, v71, pp. 2109–11 (1997), and Ruf et al., *Thermal Conductivity of Isotopically-enriched Silicon*, Solid State Communications, v115, pp. 243–47 (2000), both of which are incorporated herein in their entirety by this reference. Isotopically-enriched means the silicon has a higher proportion of one of the isotopes of silicon than is present in naturally occurring silicon (e.g., it is composed of at least 98% $^{28}$Si).

Isotopically pure germanium has also demonstrated improved thermal conductivity over naturally occurring germanium crystals as described in Ozhogin et al, *Isotope Effects in the Thermal Conductivity of Germanium Single Crystals*, JETP Letters, Vol. 63, No. 6, pp490–494, (1996), and in Asen-Palmer et al, *Thermal Conductivity of Germanium Crystals with different Isotopic Compositions*, Physical Review B, Vol. 56, No. 15, pp 9431–9447, (1997) incorporated herein in its entirety by this reference. In the case of germanium, isotopically-enriched means the enriched germanium has a higher proportion of one of the isotopes of Ge than is present in naturally occurring germanium (e.g., it is composed of at least 80% $^{74}$Ge).

The present invention is directed to the production of semiconductor wafers fabricated from single-crystal silicon, gallium arsenide, or gallium nitride which can support significantly higher power densities and can maintain temperatures cooler than semiconductor wafers fabricated from naturally occurring silicon, gallium arsenide, or gallium nitride wafers. The current invention also provides methods of fabricating these isotopically-enriched semiconductor wafers that are more economical than the traditional crystal growth techniques.

Silicon, gallium, germanium and other elements can be enriched by any number of commercially available methods widely known in the art including high speed centrifuge, gaseous diffusion, laser assisted magnetic separation, and various chemical extraction techniques. The selection of a specific technique is dependent upon such factors as cost, mass of the element to be separated, and throughput requirements. The purified isotopes of silicon (e.g., $^{28}$Si), germanium (e.g., $^{74}$Ge), or gallium (e.g.,$^{69}$Ga) are obtained by refining the isotope from naturally occurring sources. Acceptable starting materials for silicon include silane, monochlorosilane, dichlorosilane, trichlorosilane, silicon tetrachloride, or silicon tetrafluoride. For germanium, acceptable starting materials include germane, germanium tetrachloride, chlorogermanes, or germanium tetrafluoride. For gallium, a suitable starting material such as trimethygallium or triethylgallium is acceptable. These starting materials may be prepared using isotope separation methods as described in U.S. Pat. No. 6,103,942 incorporated herein in its entirety by this reference.

In one embodiment of the present invention, a substantially pure isotope (e.g. having a purity of at least 80%, more preferably at least 98%, more preferably at least 99.5%, and most preferably at least 99.9%) is formed as a thin layer on at least one surface of a substrate by epitaxial deposition. The substrate may be any of the known or commonly used substrate materials such as germanium, sapphire, silicon and silicon carbide. The epitaxial layer can be formed by techniques well known to those skilled in the art such as chemical vapor deposition, molecular beam epitaxy, vapor phase epitaxy, liquid phase epitaxy, atomic layer deposition, or physical vapor deposition techniques.

FIG. 1 shows the general wafer structure of the present invention. Layer 1 is the semiconductor material layer or layers composed of natural isotopic ratios, layer 2 is the heat spreading layer composed of isotopically enriched materials, and 3 is the substrate material.

In another embodiment of the present invention, a top layer of a semiconductor material is formed on top of the thin layer of substantially pure isotope on at least one surface of the substrate. A semiconductor device is then formed in the top semiconductor layer and the isotopically-enriched semiconductor layer functions as a heat spreading layer.

The wafer structure includes a substrate having the isotopically-enriched material formed as a layer on one surface of the substrate. The top semiconductor layer is then applied to the isotopically-enriched material layer. The isotopically-enriched material layer may contain silicon, germanium, silicon-germanium alloys, gallium-based compound semiconductors such as gallium arsenide, aluminum gallium arsenide, gallium nitride, gallium phosphide, gallium indium nitride, combinations and alloys thereof or any other compound semiconductor such as indium phosphide, or alloys thereof. In the case of silicon, the isotopically-enriched layer has a higher proportion of one of the isotopes of silicon than is present in naturally occurring silicon (e.g., it is composed of at least 98% $^{28}$Si). In the case of germanium, the enriched germanium layer has a higher proportion of one of the isotopes of Ge than is present in naturally occurring germanium (e.g., it is composed of at least 80% $^{74}$Ge). In the case of GaAs or other gallium compounds, the gallium in the enriched GaAs layer has a higher proportion of one of the isotopes of Ga than is present in naturally occurring gallium (e.g., it is composed of at least 80% $^{69}$Ga or $^{71}$Ga).

The semiconductor wafer structure is fabricated by forming the isotopically-enriched materials as a layer on one surface of the substrate by means of epitaxial deposition, layer transfer, bonding of an isotopically-enriched semiconductor wafer to a natural semiconductor wafer or other methods known to those skilled in the art of semiconductor wafer manufacture. The top semiconductor layers are then formed on top of the isotopically-enriched materials by means of epitaxial deposition, molecular beam epitaxy (MBE), layer transfer, wafer bonding or other methods known to those skilled in the art of wafer manufacture, and a semiconductor device is formed in the top semiconductor layers. The isotopically-enriched materials layer underlies the entire surface of the top semiconducting layer and covers the entire face of at least one surface of the substrate, thereby providing increased heat dissipation for the complete semiconductor wafer device.

In another embodiment of the present invention, the substrate is removed to produce a semiconductor wafer structure composed of a semiconductor device formed in a top layer of semiconducting materials formed on a layer of isotopically-enriched materials. The structure is fabricated by first forming a layer of isotopically-enriched materials on a substrate, and then forming a layer or layers of semiconductor materials on top of the layer of isotopically-enriched materials. The top layer(s) of semiconductor may be any known semiconducting material or materials such as gallium arsenide, aluminum gallium arsenide, gallium nitride or indium gallium nitride. A semiconductor device is then formed in the top semiconductor layer(s). The underlying substrate is then removed to leave a substantially pure layer of isotopically-enriched materials with high thermal conductivity having a top semiconductor layer composed of natural isotopic ratios containing semiconductor devices fabricated therein. Alternatively, the substrate may be removed from beneath the layer of isotopically-enriched materials before the semiconductor devices are formed in the top semiconductor layer.

The isotopically-enriched materials are formed as a layer on one surface of the substrate by means of epitaxial deposition, layer transfer, bonding of an isotopically-enriched semiconductor wafer to a natural semiconductor wafer or other method known to those skilled in the art of semiconductor wafer manufacture. The semiconductor layer may be silicon, germanium, and silicon-germanium alloys and compound semiconductors such as gallium arsenide, aluminum gallium arsenide, gallium nitride, gallium phosphide, gallium indium nitride, and combinations and alloys thereof. A preferred embodiment, the semiconductor layer is naturally-occurring silicon and the isotopically-enriched layer is silicon enriched to at least 98% $^{28}$Si. The underlying substrate is substantially removed by any means known to those skilled in the art including, for example, mechanical grinding, chemical etching, plasma etching or a combination of these techniques.

The resulting semiconductor wafer produced by this method is at least about 1.0 micrometers thick, preferably at least about 10 micrometers thick, and more preferably at least about 100 micrometers thick, and most preferably up to about 400 micrometers thick. Using this fabrication methodology, the advantages of the isotopically pure wafers are realized while avoiding the considerable cost disadvantages of the common fabrication methodology for bulk isotopically-enriched pure silicon wafers.

In another embodiment of the present invention, the top semiconductor structure includes a layer of naturally occurring silicon, Si-Ge, GaAs, GaN, AlGaAs, GaP, GaInN, or combinations of these compounds, in which a semiconductor or opto-electronic device is fabricated, and the underlying isotopically-enriched material layer on at least one surface of a substrate. For example, the underlying isotopically-enriched semiconductor layer may be silicon enriched in the silicon-28 isotope to at least 98% $^{28}$Si, to provide increased thermal conductivity.

The higher thermal conductivity recognized with the semiconductor wafers of this invention means that devices fabricated on these wafers exhibit lower device temperatures than previously possible using conventional compositions. Additionally, the higher thermal conductivity makes it possible to increase device packing densities and to increase power output per unit area of power devices. The use of the present invention in such cases improves the thermal performance of the devices.

What is claimed is:

1. A wafer structure comprising:
   a substrate;
   a layer of an isotopically-enriched material on at least one surface of said substrate; and
   at least one layer of semiconductor material having a natural isotopic ratio on the surface of said isotopically-enriched layer, wherein said isotopically-enriched material has a higher thermal conductivity than said at least one layer of semiconductor material.

2. The wafer structure of claim 1, wherein the substrate is selected from the group consisting of germanium, sapphire, silicon and silicon carbide.

3. The wafer structure of claim 1, wherein the isotopically-enriched material is selected from the group consisting of isotopically-enriched silicon, germanium, silicon-germanium alloys, gallium arsenide, aluminum gallium arsenide, gallium nitride, gallium phosphide, gallium indium nitride, indium phosphide and combinations and alloys thereof.

4. The wafer structure of claim 3, wherein the isotopically-enriched material is selected from the group consisting of isotopically-enriched silicon, silicon-germanium alloys and combinations and alloys thereof, and wherein the silicon isotope of the isotopically-enriched material is enriched to greater than 98% $^{28}$Si.

5. The wafer structure of claim 3, wherein the isotopically-enriched material is selected from the group consisting of isotopically-enriched germanium, silicon-germanium alloys, and combinations and alloys thereof, and wherein the germanium isotope of the isotopically-enriched material is enriched to at least 80% $^{74}$Ge.

6. The wafer structure of claim 3, wherein the isotopically-enriched material is selected from the group consisting of isotopically-enriched gallium arsenide, aluminum gallium arsenide, gallium nitride, gallium phosphide, gallium indium nitride and combinations and alloys thereof, and wherein the gallium isotope of the isotopically-enriched material is enriched to at least 80% $^{69}$Ga.

7. The wafer structure of claim 3, wherein the isotopically-enriched material is selected from the group consisting of isotopically-enriched gallium arsenide, aluminum gallium arsenide, gallium nitride, gallium phosphide, gallium indium nitride and combinations and alloys thereof, and wherein the gallium isotope of the isotopically-enriched material is enriched to at least 80% $^{71}$Ga.

8. A method for enhancing cooling characteristics in operating semiconductor devices, comprising:
   providing a semiconductor substrate having a natural isotopic ratio;
   depositing a heat-spreading layer on said semiconductor substrate, the heat-spreading layer comprising an isotopically-enriched semiconductor material;
   depositing a device layer on said heat-spreading layer, said device layer comprising a semiconductor material having a natural isotopic ratio and adapted to receive processing to form semiconductor devices within the device layer, wherein said heat-spreading layer has a higher thermal conductivity than said device layer and is operable to dissipate heat generated from the semiconductor devices more efficiently than material having a natural isotopic ratio, thereby enhancing the cooling in the operating semiconductor devices.

9. The wafer structure of claim 1, wherein a semiconductor device is formed in the semiconductor material having a natural isotopic ratio.

10. The wafer structure of claim 1, wherein the layer of isotopically-enriched material is deposited on the substrate, and the semiconductor material having a natural isotopic ratio is deposited on the layer of isotopically-enriched material, and wherein following the deposition of the layers on the substrate the substrate is substantially completely removed.

11. The wafer structure of claim 1, wherein the isotopically-enriched material is formed on the at least one surface of the substrate by a process selected from the group consisting of chemical vapor deposition, molecular beam epitaxy, vapor phase epitaxy, liquid phase epitaxy, atomic layer deposition and physical vapor deposition.

12. A method of making a wafer structure comprising
   a. depositing a layer of an isotopically-enriched material on at least one surface of a substrate by epitaxial deposition,
   b. forming at least one semiconductor layer having a natural isotopic ratio on top of the isotopically-enriched material, and
   c. forming a semiconductor device in the semiconductor layer having a natural isotopic ratio.

13. The method of claim 12, comprising the additional step of removing the substrate from beneath the isotopically-enriched material after the forming of a semiconductor device in the semiconductor layer having a natural isotopic ratio.

14. The method of claim 12, comprising the additional step of removing the substrate from beneath the isotopically-enriched material before the forming of a semiconductor device in the semiconductor layer having a natural isotopic ratio.

15. The method of claim 13 wherein the substrate is removed by a means selected from the group consisting of mechanical grinding, chemical etching, plasma etching and a combination of thereof.

16. The wafer structure produced by the method of claim 12.

17. The wafer structure produced by the method of claim 14.

18. The wafer structure produced by the method of claim 13.

19. The wafer structure of claim 18, wherein the isotopically-enriched material comprises silicon enriched to at least 98% $^{28}$Si, and wherein the semiconductor layer having a natural isotopic ratio comprises silicon having naturally-occurring isotopic ratios.

20. The method of claim 12, wherein the at least one semiconductor layer having a natural isotopic ratio comprises a material selected from the group consisting of Si, SiGe, GaAs, GaN, AlGaAs, GaP, InGaN and combinations thereof.

* * * * *